(12) United States Patent
Pham et al.

(10) Patent No.: US 7,943,988 B2
(45) Date of Patent: May 17, 2011

(54) POWER MOSFET WITH A GATE STRUCTURE OF DIFFERENT MATERIAL

(75) Inventors: Daniel Pham, Austin, TX (US); Bich-Yen Nguyen, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 12/205,438

(22) Filed: Sep. 5, 2008

(65) Prior Publication Data
US 2010/0059817 A1 Mar. 11, 2010

(51) Int. Cl.
*H01L 29/78* (2006.01)

(52) U.S. Cl. ........ 257/329; 257/328; 257/331; 257/407; 257/E29.256; 257/E29.257; 257/E29.258; 257/E29.259; 257/E29.26; 257/E29.261; 257/E21.417; 257/E21.418; 257/E21.421; 438/156; 438/157; 438/197; 438/212

(58) Field of Classification Search .................. 257/407, 257/E26.134, E29.134; 438/197, 283
See application file for complete search history.

(56) References Cited

U.S. PATENT DOCUMENTS

| | | | |
|---|---|---|---|
| 6,239,463 B1 | 5/2001 | Williams et al. | |
| 6,312,995 B1 * | 11/2001 | Yu | 438/283 |
| 6,528,399 B1 * | 3/2003 | Alieu et al. | 438/561 |
| 6,680,504 B2 | 1/2004 | Howard et al. | |
| 6,930,356 B2 | 8/2005 | Choi et al. | |
| 2004/0119076 A1 | 6/2004 | Ryu | |
| 2006/0244079 A1 * | 11/2006 | Wang et al. | 257/407 |
| 2007/0158658 A1 * | 7/2007 | Ryu | 257/77 |

OTHER PUBLICATIONS

S. Tiwari, et al, "Straddle-Gate Transistor: Changing MOFSET Channel Length Between Off- and On-State Towards Achieving Tunneling-Defined Limit of Field-Effect," IEEE, IEDM 98, pp. 737-774.*
W. Long, et al., "Dual-Material Gate (DMG) Field Effect Transistor", IEEE, vol. 46, No. 5, May 1999, pp. 865-887.*
W. Long, et al., "Dual-Material Gate (DMG) Field Effect Transistor", IEEE, vol. 46, No. 5, May 1999, pp. 865-870.
S. Tiwari, et al., "Straddle-Gate Transistor: Changing MOFSET Channel Length Between Off- and On-State Towards Achieving Tunneling-Defined Limit of Field-Effect," IEEE, IEDM 98, pp. 737-740.
K. Shenai, "Optimally Scaled Low-Voltage Vertical Power MOSFET's for High-Frequency Power Conversion," IEEE, vol. 37, No. 4, Apr. 1999, pp. 1141-1153.
PCT Application No. PCT/US2009/048767; Search Report and Written Opinion dated Feb. 9, 2010.

* cited by examiner

*Primary Examiner* — Tom Thomas
*Assistant Examiner* — Farid Khan
(74) *Attorney, Agent, or Firm* — David G. Dolezal; James L. Clingan, Jr.

(57) ABSTRACT

A semiconductor device includes a semiconductor layer of a first conductivity type and a first doping concentration. A first semiconductor region, used as drain, of the first conductivity type has a lower doping concentration than the semiconductor layer and is over the semiconductor layer. A gate dielectric is over the first semiconductor region. A gate electrode over the gate dielectric has a metal-containing center portion and first and second silicon portions on opposite sides of the center portion. A second semiconductor region, used as a channel, of the second conductivity type has a first portion under the first silicon portion and the gate dielectric. A third semiconductor region, used as a source, of the first conductivity type is laterally adjacent to the first portion of the second semiconductor region. The metal-containing center portion, replacing silicon, increases the source to drain breakdown voltage.

21 Claims, 9 Drawing Sheets

POWER MOSFET WITH A GATE STRUCTURE OF DIFFERENT MATERIAL

BACKGROUND OF THE INVENTION

1. Field of the Invention

This invention relates in general to semiconductor devices and more particularly MOSFETs.

2. Description of the Related Art

MOSFETs can be used as power switches for relativity high voltages and/or high currents in electronic systems. As dimensions in semiconductor circuits decrease, in some MOSFETS, the polysilicon gate length is reduced. This may lead to a reduced channel region under the gate. A reduction in the channel region reduces the amount of area of the channel that the gate can control and thereby reduces the breakdown voltage of the transistor.

What is needed is an improved MOSFET device.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The Figures are not necessarily drawn to scale.

DETAILED DESCRIPTION

The following sets forth a detailed description of a mode for carrying out the invention. The description is intended to be illustrative of the invention and should not be taken to be limiting.

Figure 1:
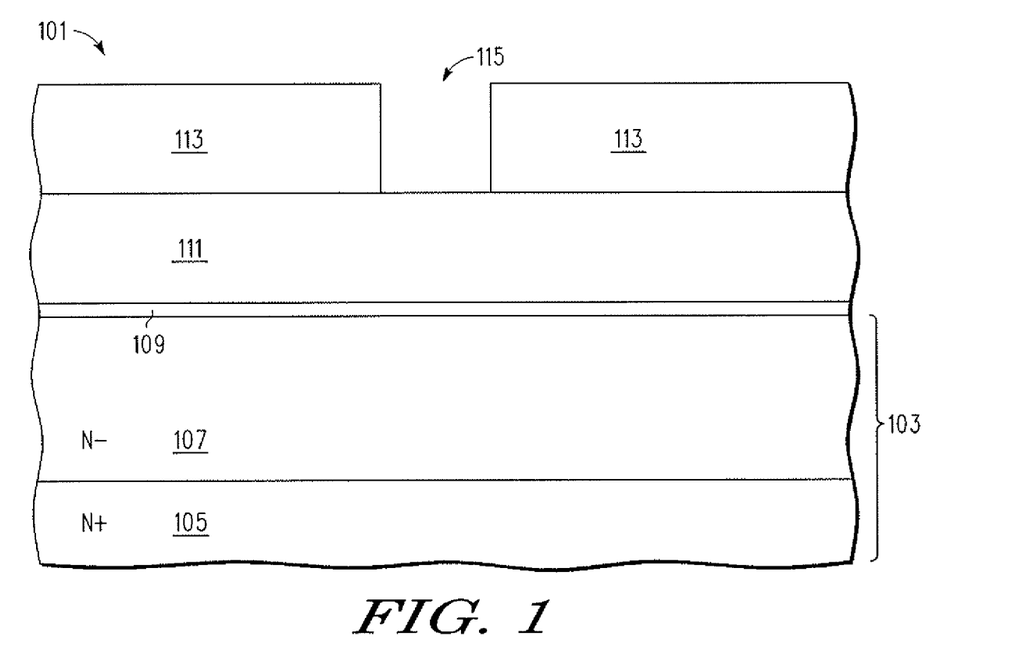
FIGS. 1-12 are partial cutaway side views of various stages in the manufacture of semiconductor device according to one embodiment of the present invention.

FIG. 1 is a partial cutaway side view of a wafer 101 that will be used to manufacture a MOSFET according to one embodiment of the present invention. In the embodiment shown, wafer 101 includes a substrate 103 of silicon or other semiconductor material (e.g. silicon germanium, silicon carbon, silicon germanium carbon, gallium arsenide, indium phosphide, indium arsenide, other III/V compound semiconductors, or any combination thereof).

A lower layer 105 of substrate 103 is doped with N conductivity type (N type) impurities (e.g. arsenic, phosphorous) at a relatively high concentration (shown as N+ in FIG. 1). Layer 107 is doped with N-type impurities at a lower doping concentration than layer 105. In one embodiment, layer 105 maybe and initially insitu doped substrate at an N+ concentration, and layer 107 would be epitaxially grown on the substrate (layer 105). Layer 105 may be insitu doped or implanted with N-type impurities. However, substrate 103 may be formed by other methods in other embodiments. In one embodiment layer 107 has a thickness in the range of 1 to 5 microns, but may have other thicknesses in other embodiments. In one embodiment, layer 107 has an N-type doping concentration in the range of $10^{13}/cm^3$-$10^{15}/cm^3$, but may be of other concentrations in other embodiments. In one embodiment, layer 105 has an N-type doping concentration in the range of $10^{15}/cm^3$-$10^{20}/cm^3$, but may be of other concentrations in other embodiments.

A layer of gate dielectric material 109 is formed on layer 107. In one embodiment, layer 109 is formed by the oxidation of layer 107. In other embodiments, layer 109 is formed by a deposition process. In one embodiment, layer 109 is made of silicon dioxide, but may be made of other dielectric materials (e.g. a metal oxide) in other embodiments. In some embodiments, layer 109 has a thickness in the range of 300-500 Angstroms, but may have other thicknesses in other embodiments.

A layer 111 of polysilicon is formed over layer 109. In one embodiment, layer 111 is doped N-type impurities at a concentration in the range of $10^{15}/cm^3$-$10^{20}/cm^3$, but may be of other concentrations in other embodiments. In one embodiment, layer 111 has a thickness in the range of 1500 to 3000 Angstroms, but may have other thicknesses in other embodiments. In some embodiments, layer 111 may include other materials such as e.g. germanium.

A layer 113 of photo resist is formed on layer 111. An opening 115 in layer 113 is formed (e.g. by a lithographic process) to expose layer 111. In one embodiment, opening has a width (the dimension shown in FIG. 1) in the range of 0.1 microns to 1.3 microns, but maybe of other widths in other embodiments. Afterward the formation of opening 115, layer 111 is etched to form an opening corresponding to opening 115 to expose gate dielectric layer 109.

Figure 2:
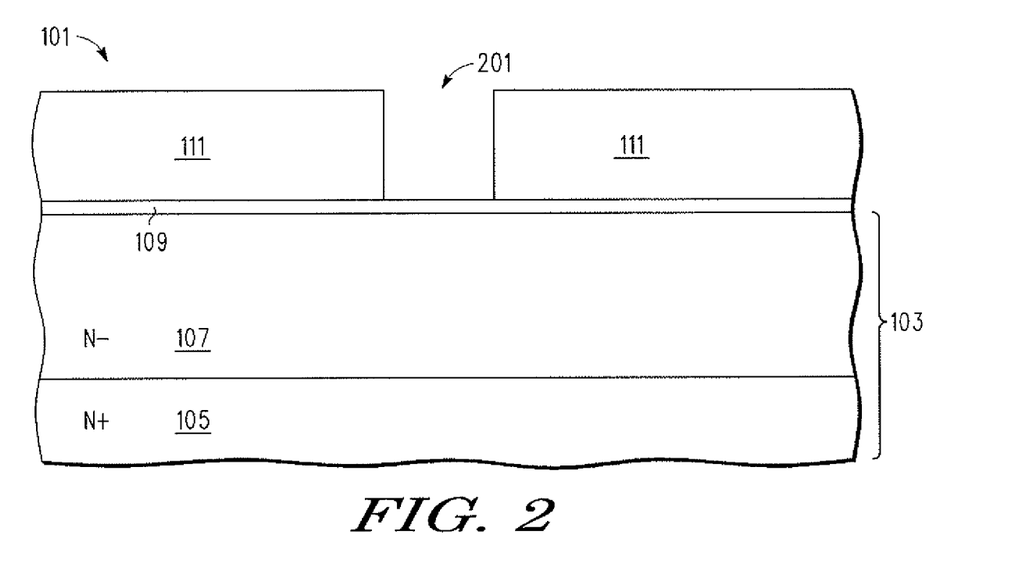

FIG. 2 shows a view of wafer 101 after layer 111 has been etched to form opening 201 and layer 113 of photo resist has been removed. Opening 201 has dimensions corresponding to opening 115.

Figure 3:
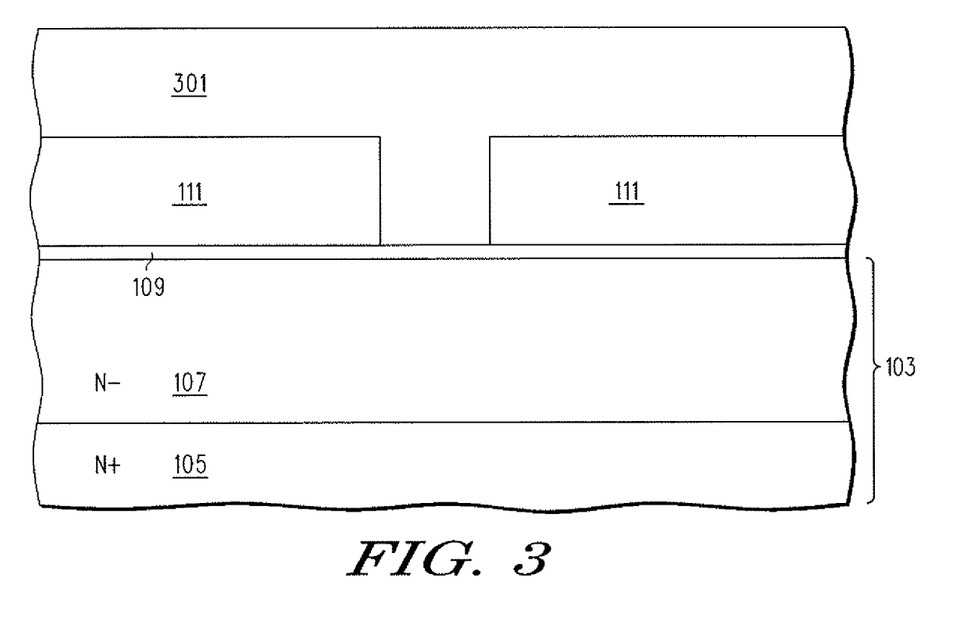

FIG. 3 shows wafer 101 after a metal containing layer 301 is formed over wafer 101 including being formed in opening 201. In one embodiment, layer 301 includes a silicide (e.g. tungsten silicide), but in other embodiments, maybe made of other materials such as a metal nitride (tantalum nitride, titanium nitride) or metal (tungsten, aluminum, tantalum, titanium), a metal alloy, or combinations thereof including combinations with a silicide (cobalt silicide, nickel silicide, tantalum carbon silicide). Accordingly, a gate electrode including a portion comprising metal encompasses embodiments where a portion includes any one or more of these materials. In some embodiments, layer 301 is formed by a deposition process such a chemical vapor deposition (CVD) process, a physical vapor deposition (PVD) process, or a plating process. In some embodiments, layer 301 may have a thickness between the top of layer 111 and the top of layer 301 in the range of 2000-4000 Angstroms, but may have other thicknesses in other embodiments. FIG. 3 shows layer 301 after it has been planarized.

Figure 4:
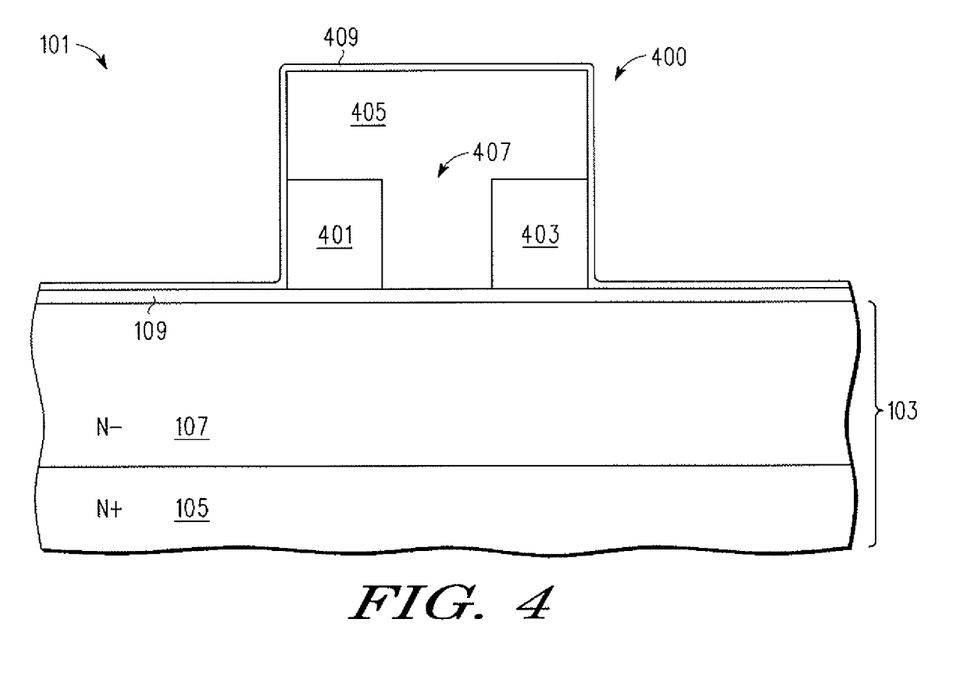

FIG. 4 shows wafer 101 after layers 301 and 111 have been patterned to form gate structure 400. In one embodiment, gate structure 400 is patterned by forming and patterning photo resist (not shown) over layer 301 and then etching layers 301 and 111 with an etchant that selective to gate oxide layer 109.

Gate structure 400 includes silicon structures 401 and 403 that are made of the material of layer 111. Structure 405 includes lower structure 407 and is made of the material of layer 301. Structures 401 and 403 are laterally separated by structure 407.

In some embodiments, gate structure 400 has a width in the range of 0.4-4 microns, but may be of other dimensions (e.g. smaller) in other embodiments. In some embodiments, structure 407 has a width that is ¼ to ⅓ the width of structure 400. However, in other embodiments, the width of structure 407 may be at other ratios to the width of structure 400 in other embodiments.

After the formation of structure 400, a thin dielectric liner 409 (e.g. 20-100 angstroms) of silicon dioxide or silicon nitride is formed over wafer 101.

Figure 5:
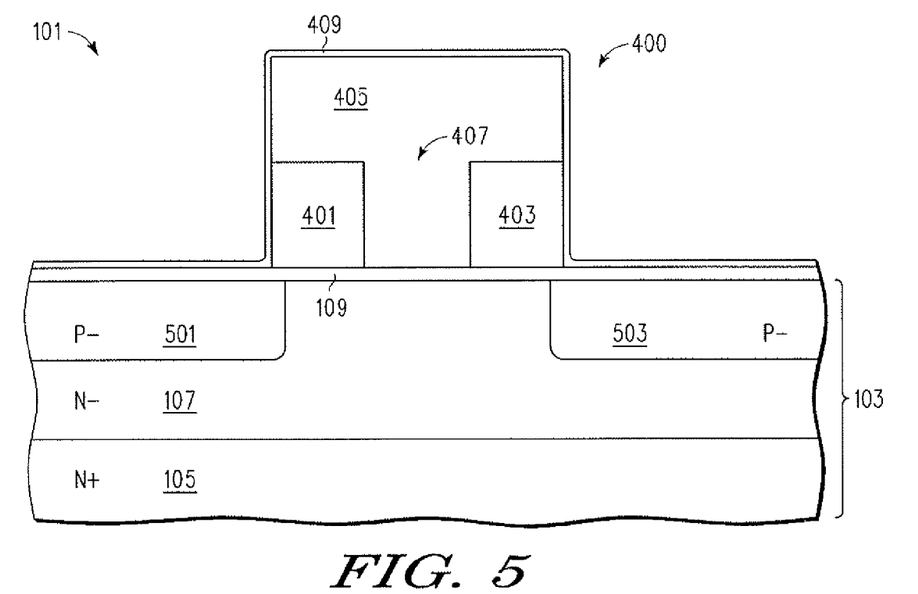

FIG. 5 shows wafer 101 after P-type regions 501 and 503 are formed by implanting P conductivity type (P-type) impurities (e.g. Boron) into layer 107. Structures 401 and 403 are generally protected from implantation by structure 405. Gate structure 400 prevents the implantation of P-type impurities in layer 107 at a location beneath it. The P-type impurities are implanted to a depth less than the bottom of layer 107. In some embodiments, the P-type impurities are implanted at an angle (e.g. at 7-15 degrees from vertical) so that some of the P-type impurities are implanted beneath structures 401 and 403. In one embodiment, the P-type impurities (P-type dopants) have a doping concentration in the range of $10^{13}/cm^3$-$10^{15}/cm^3$, but may be at other concentrations in other embodiments.

Figure 6:
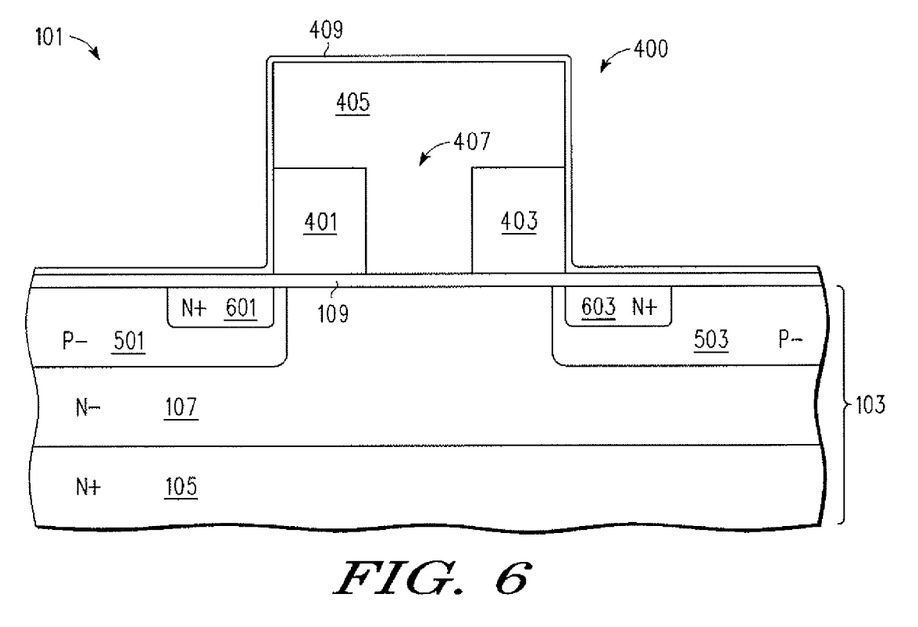

FIG. 6 shows wafer 101 after N-type impurities are implanted in regions 501 and 503 to form N+ type regions 601 and 603 respectively. The N-type impurities are implanted to a depth that is less than the depth of regions 501 and 503. In one embodiment, N-type impurities (N-type dopants) are implanted at a concentration in the range of $10^{15}/cm^3$-$10^{20}/cm^3$, but may be at other concentrations in other embodiments. In some embodiments, the N-type dopants are implanted at an angle so that some of region 601 is under structure 401 and some of region 603 is under structure 403. In the embodiment shown, this angle is less than the angle of implantation of the P-type dopants for regions 501 and 503.

In the embodiment shown, a masking layer (not shown) is patterned to form an opening to define the outer sides of regions 601 and 603 as shown in the view of FIG. 6. Gate structure 400 acts as a mask to define the inner sides of regions 601 and 603.

Figure 7:
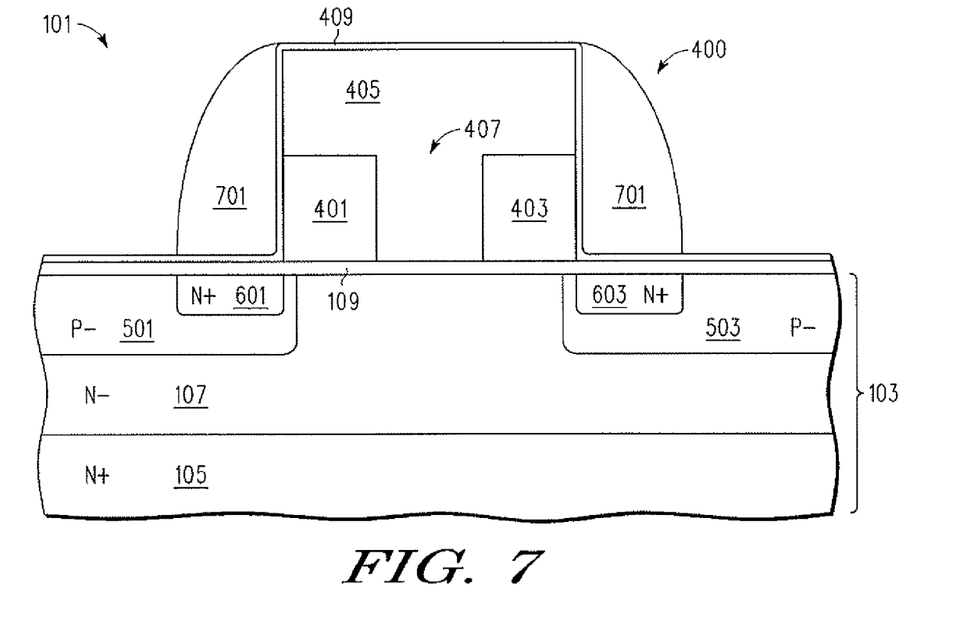

FIG. 7 shows a view of wafer 101 after spacers 701 are formed laterally adjacent to gate structure 400. Spacers 701 are made of a material that is etched by an etchant that is etch selective to liner 409. In one embodiment where liner 409 is made of silicon dioxide, spacers 701 are made of silicon nitride. In one embodiment, spacers 701 are formed by forming a layer (not shown) of spacer material over wafer 101 and anisotropically etching the layer.

Figure 8:
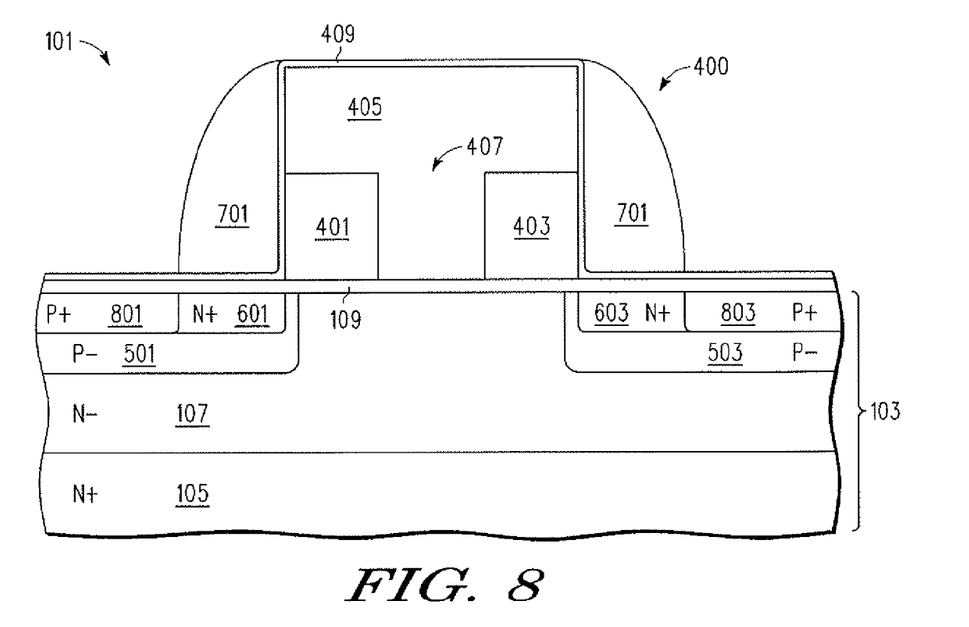

FIG. 8 shows wafer 101 after P-type impurities are implanted in wafer 101 to form regions 801 and 803. in one embodiment, the impurities are implanted to about the same depth as the bottom of regions 601 and 603. In some embodiments, regions 801 and 803 have a concentration in the range of $10^{15}/cm^3$-$10^{20}/cm^3$, but may be of other concentrations in other embodiments.

Figure 9:
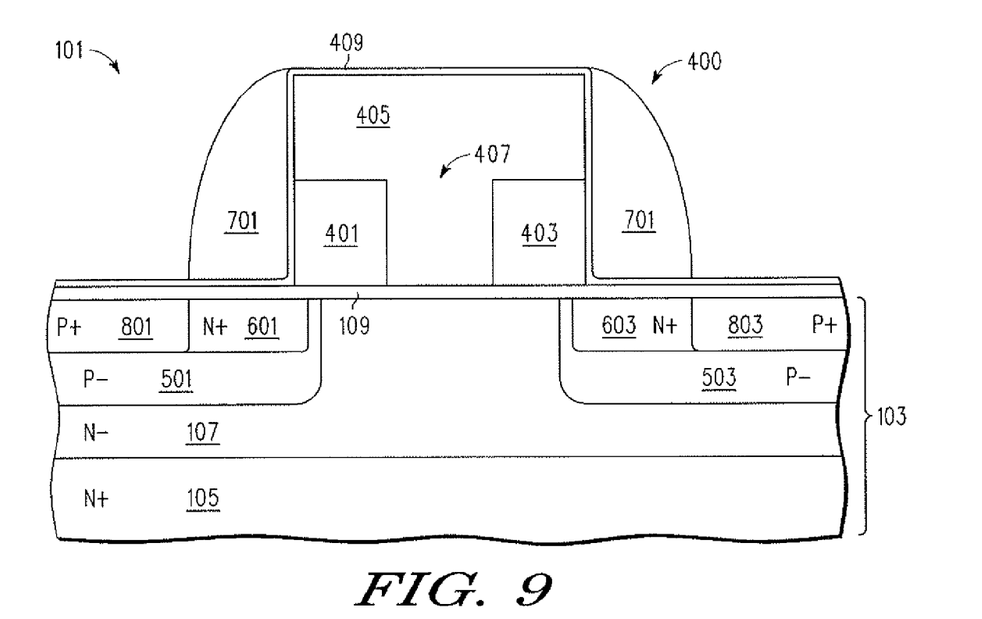

FIG. 9 shows wafer 101 after the dopants of regions 801, 803, 501, 503, 601, and 603 are activated by heating wafer 101 (e.g. at 900-1150 C in some embodiments). Activating the dopants diffuses the dopants in layer 107 to expand these regions. In one embodiment, the dopants implanted to form regions 501 and 503 are activated and diffused before the implantation of the dopants for regions 601 and 603.

Figure 10:
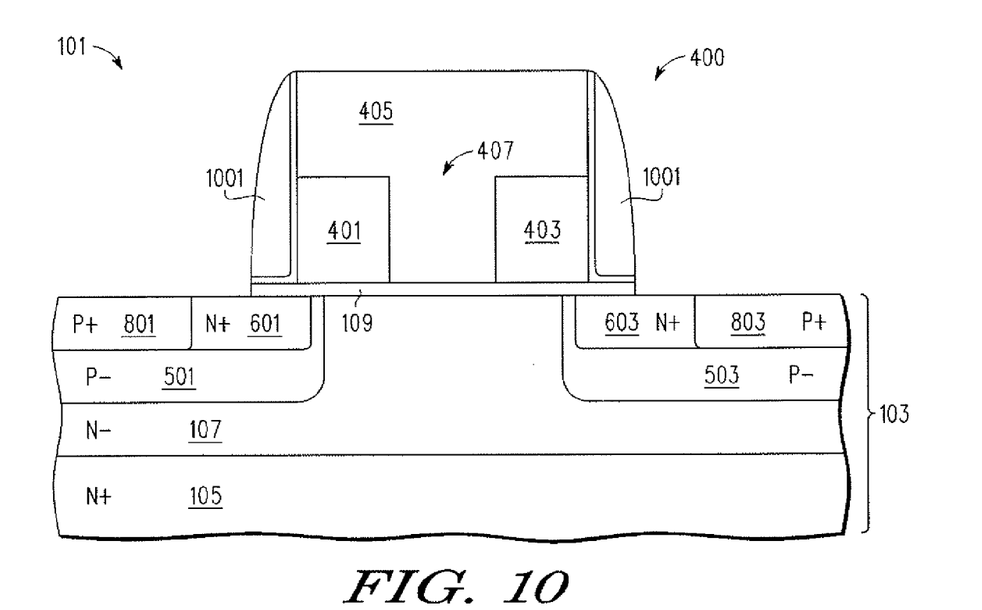

FIG. 10 shows wafer 101 after spacers 701 have been removed and thinner spacers 1001 are formed. In one embodiment, spacers 701 are removed with an etch that is selective to dielectric liner 409. A layer of spacer material (not shown) is subsequently deposited on wafer 101. The layer is then anisotropically etched with an etchant that also removes the exposed portion of liner 409 and gate dielectric layer 109 as well as etching the layer of spacer material. In some embodiments, liner 409 and dielectric layer 109 may be removed with a subsequent etch after the etch for forming spacer 1001.

Figure 11:
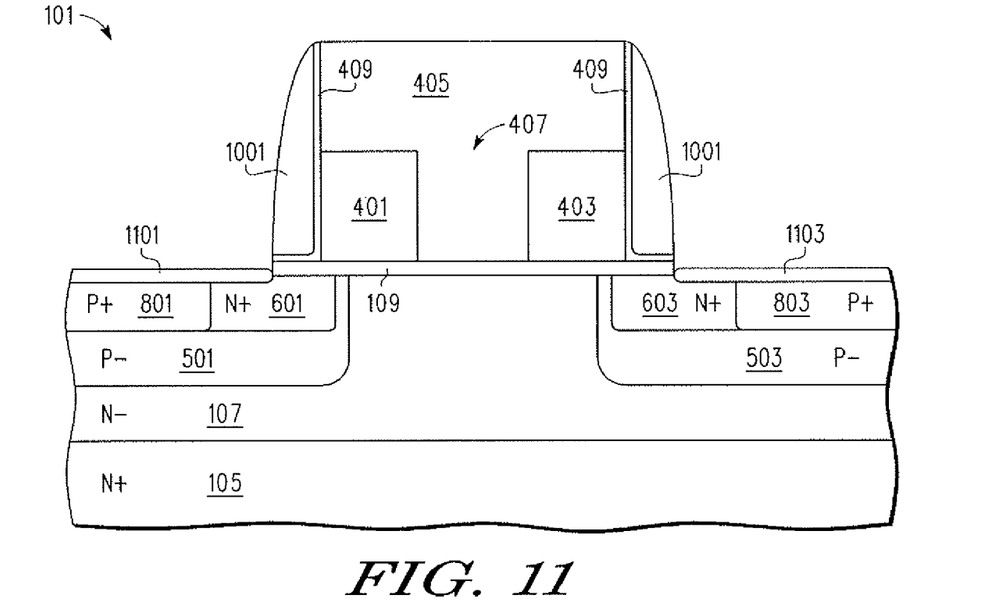

FIG. 11 shows wafer 101 after the drain silicides 1101 and 1103 are formed on wafer 101. Drain silicide 1101 contacts regions 801 and 601. Drain silicide 1103 contacts regions 603 and 803. In one embodiment, silicides 1101 and 1103 are formed by depositing a layer of metal (e.g. cobalt, nickel, tantalum) over wafer 101 and heating wafer 101 where the metal reacts with the exposed silicon to form the silicide. Afterwards, the unreacted metal is removed.

Subsequent to the view shown in FIG. 11, electrical contacts (not shown) of e.g. tungsten may be formed to electrically contact silicides 1101 and 1103 and to electrically contact structure 405 of gate structure 400. Also contacts are made to layer 105, either from the backside of wafer 101 or from the top side at another location of wafer 101. These structures may be electrically coupled to other conductive structures (not shown) by electrical interconnects (not shown) formed in inter level dielectric layers (not shown) on wafer 101. In some embodiments, each silicide of silicides 1101 and 1103 may have multiple contacts formed to contact the silicide. Afterwards, bond pads (not shown) may be formed on the interlayer dielectric material. The wafer is then singulated to form multiple integrated circuit die, each with the structures shown in FIG. 11.

Figure 12:
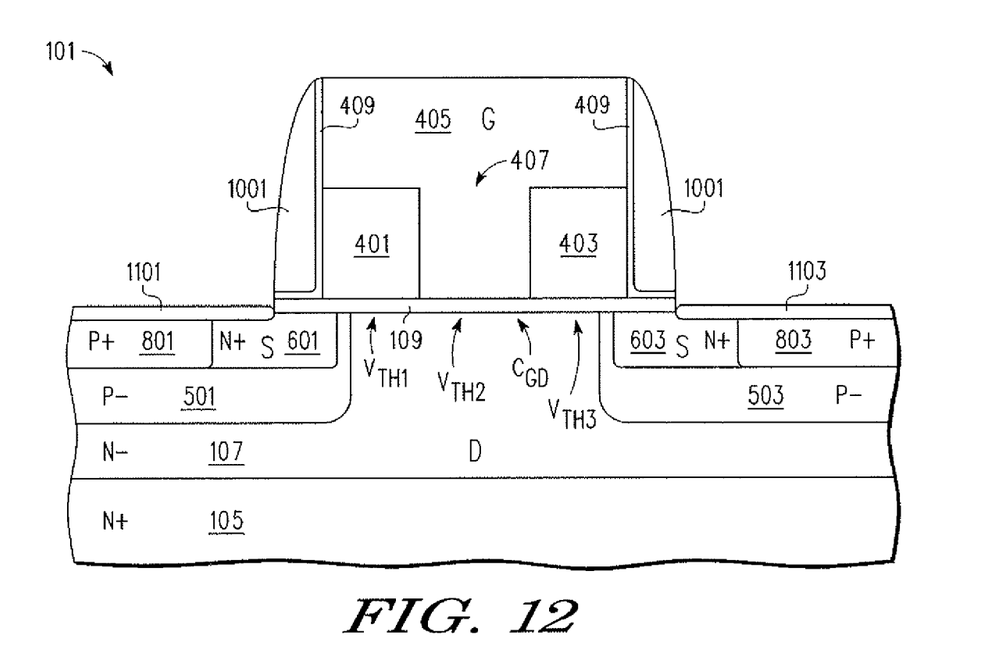

FIG. 12 shows the same view of wafer 101 as FIG. 11. As shown in the FIG. 12, two transistors are shown in FIG. 12 where gate structure 400 is the gate electrode for both transistors and layer 107 is the drain for both transistors. Region 601 is the source for one transistor and region 603 is the source for the other transistor. In some embodiments, silicides 1101 and 1103 maybe electrically coupled together (e.g. by electrically conductive interconnects (not shown)). In such an embodiment, the device operates as one MOSFET transistor.

When gate structure 400 is biased at a voltage above the voltage threshold of the MOSFET, current flow from source silicide 1101 to drain contact layer 105 and flow from source silicide 1103 to drain layer 105 provided that the source voltage is greater than the drain voltage by the voltage threshold of the transistor. The portion of region 501 between region 601 and layer 107 beneath structure 401 and the portion of region 503 between region 603 and layer 107 beneath structure 403 act as the channel regions for the transistor.

Because gate structure 400 includes structure 407 that is of a material (such as tungsten silicide or includes another metal), the work function of the material of structure 407 is at mid-gap while the work function of the material of structures 401 and 403 are at the band-edge. The voltage threshold ($V_{TH2}$) below structure 407 is greater than the voltage threshold ($V_{TH1}$ and $V_{TH3}$) below structures 401 and 403, respectively. Therefore the device advantageously has a higher channel breakdown voltage than if structure 407 was made of the same material as structures 401 and 403. Accordingly, the device shown in FIG. 12 can handle higher operating voltages than a device where structure 407 is of the same material as structures 401 and 403.

When the gate voltage is greater than $V_{TH2}$, the device shown in FIG. 12 is in a fully conductive state. The channel resistance ($R_{ON}$) for the device in FIG. 12 would be the same as if structures 407 where made of the same material as structures 401 and 403.

Furthermore, having structure 407 be of a lower resistive material than the material of structures 401 and 403 may also reduce the resistivity of the gate structure.

FIG. 12 shows an N-type power MOSFET. However, in other embodiments, a P-type power MOSFET can be made by switching the conductivity types of the regions of the device of FIG. 12. For example, for a P-type MOSFET, regions 801, 803, 501, and 503 would have an N-type doping and layers 105 and 107, and regions 601 and 603 would have a P-type doping.

Figure 13:
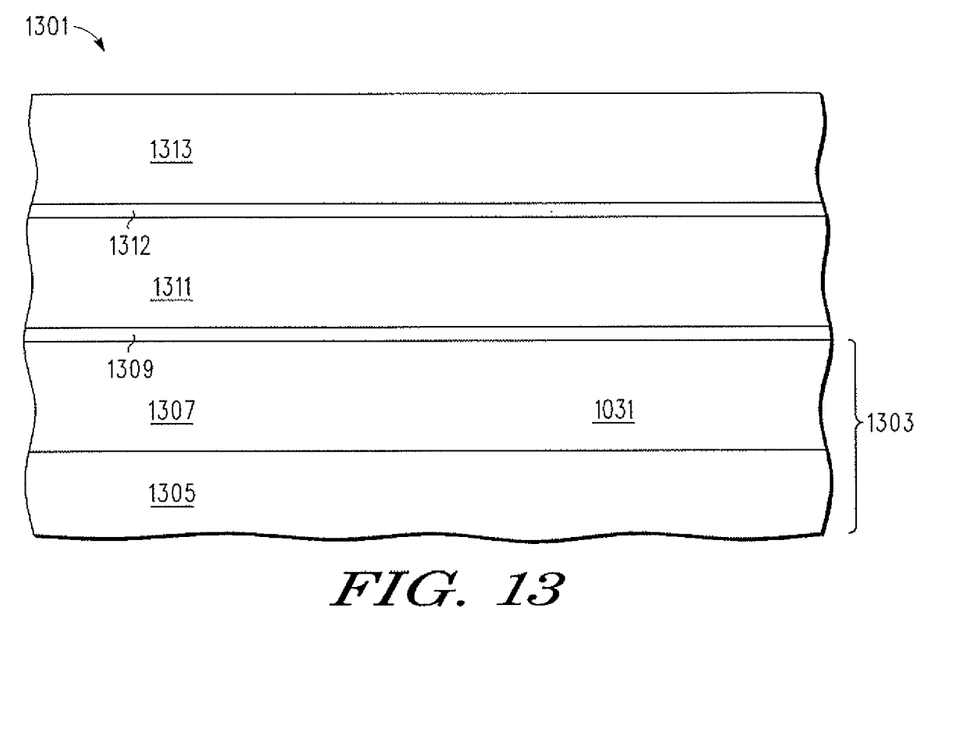
FIGS. 13-17 are partial cutaway side views of various stages in the manufacture of semiconductor device according to another embodiment of the present invention.

FIG. 13 shows a partial cut away view of a wafer 1301 that is used to form a gate structure similar to gate structure 400 according to another embodiment of the present invention. In the embodiment of FIG. 13, substrate 1303, layers 1305, 1307, and 1309, and polysilicon layer 1311 are similar to substrate 103, layers 105, 107, and 109, and polysilicon layer 111, respectively. In the embodiment of FIG. 13, a hard mask layer 1312 is formed over layer 1311. In one embodiment, hard mask layer 1312 is made of silicon nitride or other suitable material. A photo resist layer 1313 is formed on hard mask layer 1312.

Figure 14:
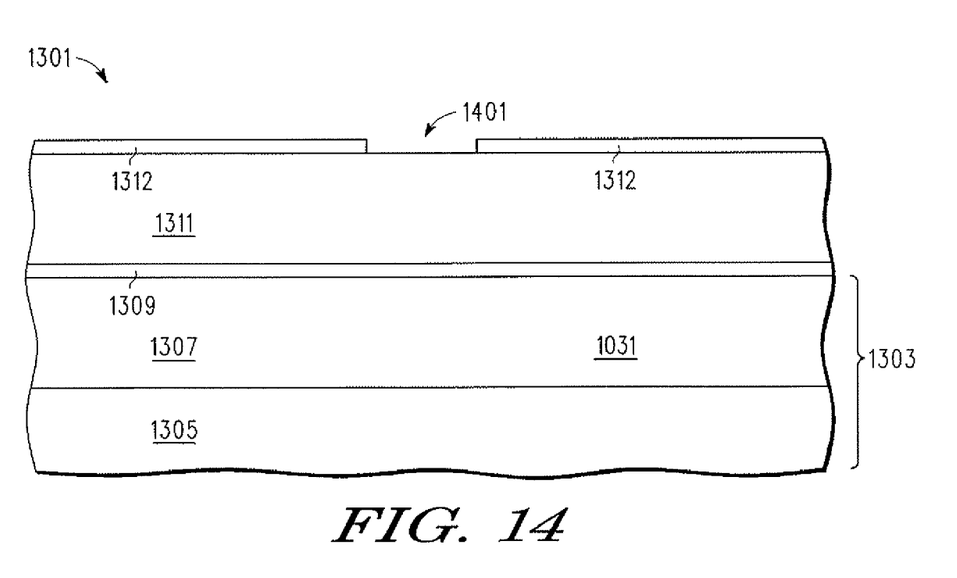

FIG. 14 shows wafer 1301 after an opening 1401 is formed in hard mask layer. Opening 1401 is formed by forming a corresponding opening in layer 1313 and then etching layer 1312 through the corresponding opening. Afterwards, photo resist layer 1313 is removed.

Figure 15:
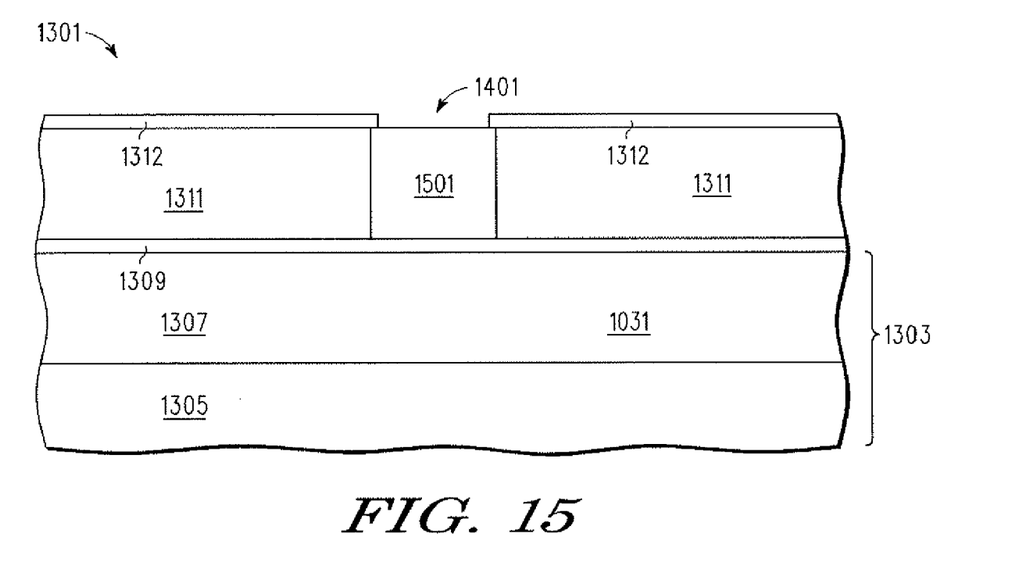

FIG. 15 shows wafer 1301 after a portion of layer 1311 is silicided to form silicide structure 1501. In one embodiment, silicide structure 1501 is formed by forming a layer of metal (e.g. titanium, cobalt, nickel, tungsten) on wafer 1301 including in opening 1401 to contact layer 1311. Wafer 1301 is then heated where the metal reacts with the silicon through opening 1401 of hard mask layer 1312 to form silicide structure 1501. In one embodiment, the thickness of layer 1311, the thickness of layer 1312, the silicidation temperature, and choice of silicide material is set to inhibit lateral silicidation of layer 1311 under mask layer 1312.

Figure 16:
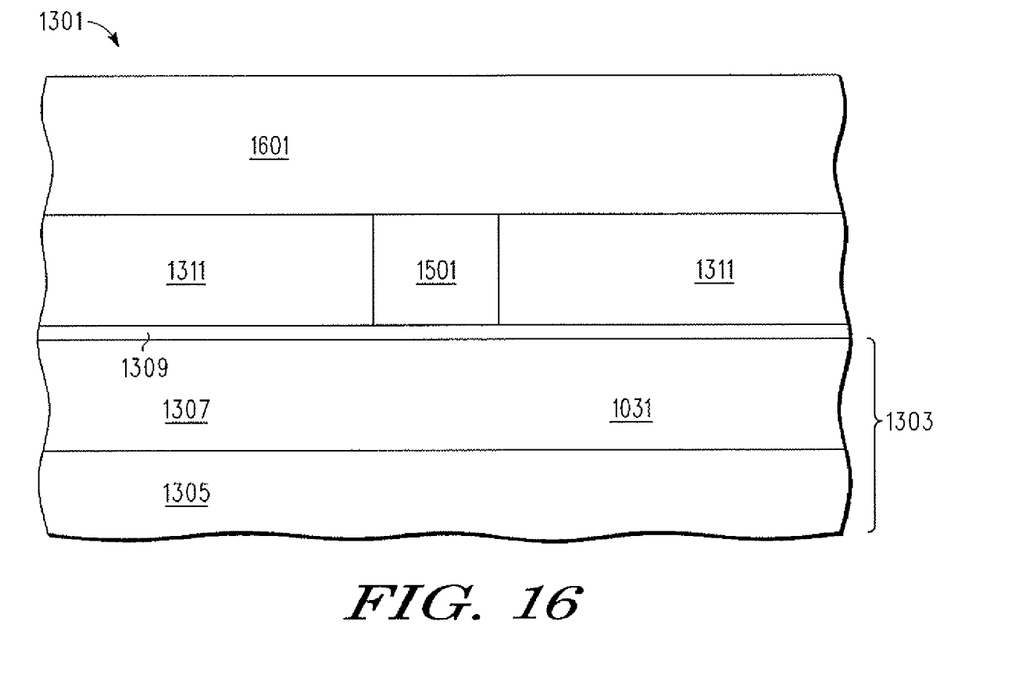

FIG. 16 shows wafer 1301 after layer 1312 has been removed and a conductive layer 1601 is formed on wafer 1301 in electrical contact with structure 1501 and layer 1311. In one embodiment layer, 1601 is formed by a CVD, PVD, plating, or other deposition process. Layer 1601 may be made of doped polysilicon, a silicide, a metal, or a metal containing material.

Figure 17:
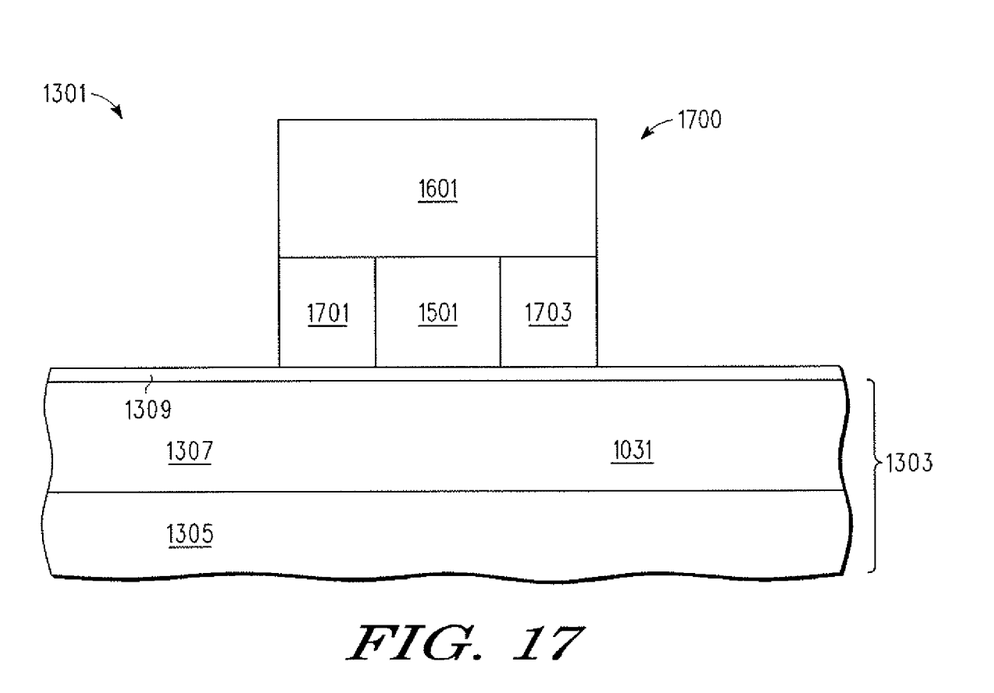

FIG. 17 shows wafer 1301 after layers 1601 and 1311 are patterned to form gate structure 1700. Gate structure 1700 includes structures 1701 and 1703 which are made from layer 1311. Structures 1701 and 1703 are laterally separated by structure 1501. In one embodiment, gate structure 1700 and structure 1501 may have similar dimensions to that of gate structure 400 and structure 407, respectively.

Wafer 1301 can be subsequently processed similar to wafer 101 to form a MOSFET as shown in FIG. 12. Because gate structure 1700 includes structure 1501 that is of a material (such as tungsten silicide or includes another metal), the voltage threshold below that portion of gate structure 1700 is greater than the voltage threshold below structures 1701 and 1703 respectively.

In some embodiments, the device in FIG. 12 may include a junction FET (JFET) region (not shown) in layer 107 below gate structure 400 between regions 501 and 503. In some embodiments the JFET doping implant would generally be at the same depth as the doping implants for regions 501 and 503. In one embodiment, this JFET implant would be of N-type impurities of a concentration in the range of $10^{15}/cm^3$-$10^{19}/cm^3$, but may be at other concentrations in other embodiments. In one embodiment, this JFET implant would be made in layer 107 before the formation of layer 111 on wafer 101. In one embodiment, the doping concentration of the JFET implant is less than the doping concentration of layer 105. In one embodiment, because the voltage threshold of the portion of layer 107 covered by structure 407 is higher than the portions covered by structures 403 and 405, the JFET doping concentration may be reduced to increase the mobility of the device.

In one embodiment, a semiconductor device includes a semiconductor layer of a first conductivity type and a first doping concentration. The semiconductor device includes a first semiconductor region above a first portion of the semiconductor layer. The first semiconductor region is of the first conductivity type and has a doping concentration less than the first doping concentration. The semiconductor device includes a gate dielectric on a top surface of the first semiconductor region and a gate electrode on the gate dielectric. The gate electrode comprises a center portion that comprises metal on the gate dielectric, a first silicon portion on the gate dielectric laterally adjacent to a first side of the center portion, and a second silicon portion on the gate dielectric laterally adjacent to a second side of the center portion in which the first side is opposite the second side. The semiconductor device includes a second semiconductor region comprising a first portion under the first silicon portion and the gate dielectric. The second semiconductor region is of a second conductivity type different from the first conductivity type. The device further including a third semiconductor region laterally adjacent to the first portion of the second semiconductor region. The third semiconductor region is of the first conductivity type.

Another embodiment includes a method of forming a semiconductor device using a first semiconductor layer having a first conductivity type and a first doping concentration with an overlying second semiconductor layer having the first conductivity type and a second doping concentration less than the first doping concentration. The method includes forming a gate dielectric over the second semiconductor layer. A portion of the second semiconductor layer to function as a drain. The method includes forming a gate electrode over the gate dielectric. The gate electrode comprises a center portion that comprises metal on the gate dielectric. A first silicon portion on the gate dielectric is laterally adjacent to a first side of the center portion. A second silicon portion on the gate dielectric is laterally adjacent to a second side of the center portion in which the first side is opposite the second side. The method includes forming a first semiconductor region in the second semiconductor layer of a second conductivity type having a portion under the first silicon portion to function as a channel. The forming the first semiconductor region includes implanting. The method further including forming a second semiconductor region of the first conductivity type having a portion to function as a source adjacent to the portion of the first semiconductor region. The forming a second semiconductor region includes implanting.

In another embodiment, a semiconductor device includes a substrate having a first semiconductor layer and a second semiconductor layer over the first semiconductor layer. The first and second semiconductor layer are of a first conductivity type and the first semiconductor layer has a higher doping concentration than the second semiconductor layer. The semiconductor device including a first pair of semiconductor regions in the second semiconductor layer of a second conductivity type separated by a first distance. The first pair of semiconductor regions extend from a top surface of the second semiconductor layer part way through the second semiconductor layer. The semiconductor device including a second pair of semiconductor regions of the first conductivity type within the second semiconductor layer and separated by a second distance greater than the first distance. The semiconductor device including a gate dielectric over a portion of the top surface of the second semiconductor layer and a gate electrode over the gate dielectric. The gate electrode has a pair of silicon portions on the gate dielectric separated by a third distance less than the first distance and a metal-containing portion on the gate dielectric between the pair of silicon portions.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. A semiconductor device, comprising:
    a semiconductor layer of a first conductivity type and a first doping concentration;
    a first semiconductor region above a first portion of the semiconductor layer, wherein the first semiconductor region is of the first conductivity type and has a doping concentration less than the first doping concentration;
    a gate dielectric on a top surface of the first semiconductor region;
    a gate electrode on the gate dielectric, wherein the gate electrode comprises a center portion that comprises metal on the gate dielectric, a first silicon portion on the gate dielectric laterally adjacent to a first side of the center portion, and a second silicon portion on the gate dielectric laterally adjacent to a second side of the center portion in which the first side is opposite the second side;
    a second semiconductor region comprising a first portion under the first silicon portion and the gate dielectric, wherein the second semiconductor region is of a second conductivity type different from the first conductivity type; and
    a third semiconductor region laterally adjacent to the first portion of the second semiconductor region, wherein the third semiconductor region is of the first conductivity type.

2. The semiconductor device of claim 1, wherein the first semiconductor region functions as a drain, the second semiconductor region functions as a channel, and the third semiconductor region functions as a source.

3. The semiconductor device of claim 1, wherein the center portion comprises a silicide.

4. The semiconductor device of claim 3, further comprising tungsten silicide on the first silicon portion and the second silicon portion.

5. The semiconductor device of claim 1, wherein the first silicon portion and the second silicon portion comprise polysilicon.

6. The semiconductor device of claim 1, wherein the second semiconductor region further comprises a second portion adjacent to the third semiconductor region under the third semiconductor region.

7. The semiconductor device of claim 6, wherein the second portion of the second semiconductor region is over and spaced from a second portion of the semiconductor layer.

8. The semiconductor device of claim 7, wherein the first semiconductor region has a second portion between the second portion of the second semiconductor region and the second portion of the semiconductor layer.

9. The semiconductor device of claim 1, further comprising a fourth semiconductor region laterally adjacent to the third semiconductor region and in contact with the second semiconductor region, wherein the fourth semiconductor region is of the second conductivity type.

10. The semiconductor device of claim 9, further comprising a metal-containing conductive layer on the fourth semiconductor region and the third semiconductor region.

11. The semiconductor device of claim 1, further comprising:
    a fourth semiconductor region comprising a first portion under the second silicon portion and the gate dielectric, wherein the fourth semiconductor region is of the second conductivity type; and
    a fifth semiconductor region laterally adjacent to the first portion of the fourth semiconductor region, wherein the fifth semiconductor region is of the first conductivity type.

12. The semiconductor device of claim 1, wherein the first conductivity type is N type and the second conductivity type is P type.

13. The semiconductor device of claim 1, wherein the first and second silicon portions further comprise germanium.

14. The semiconductor device of claim 1, wherein the first semiconductor region includes a first portion and a second portion, the first portion has a higher doping concentration of the first conductivity type than the second portion, the first portion being located above the second portion.

15. A semiconductor device, comprising:
    a substrate having a first semiconductor layer and a second semiconductor layer over the first semiconductor layer, wherein the first and second semiconductor layer are of a first conductivity type and the first semiconductor layer has a higher doping concentration than the second semiconductor layer;
    a first pair of semiconductor regions in the second semiconductor layer of a second conductivity type separated by a first distance, wherein the first pair of semiconductor regions extend from a top surface of the second semiconductor layer part way through the second semiconductor layer;
    a second pair of semiconductor regions of the first conductivity type within the second semiconductor layer and separated by a second distance greater than the first distance;
    a gate dielectric over a portion of the top surface of the second semiconductor layer; and
    a gate electrode over the gate dielectric, wherein the gate electrode has a pair of silicon portions on the gate dielectric separated by a third distance less than the first distance and a metal-containing portion on the gate dielectric between the pair of silicon portions.

16. The semiconductor device of claim 15, further comprising:
    a third pair of semiconductor regions of the second conductivity type within the second semiconductor layer and separated by a fourth distance greater than the second distance.

17. The semiconductor device of claim 15, wherein the silicon portions comprise polysilicon and the metal-containing portion comprises a silicide.

18. The semiconductor device of claim 15, further comprising a conductor layer of tungsten silicide overlying the pair of silicon portions.

19. The semiconductor device of claim 1 wherein the second semiconductor region is not located under the center portion of the gate electrode.

20. The semiconductor device of claim 2 wherein the second semiconductor region is not located under the center portion of the gate electrode.

21. The semiconductor device of claim 15 wherein a first pair of semiconductor regions function as transistor channel regions and are not located under the metal containing portion of the gate electrode.

* * * * *